Figure 1:
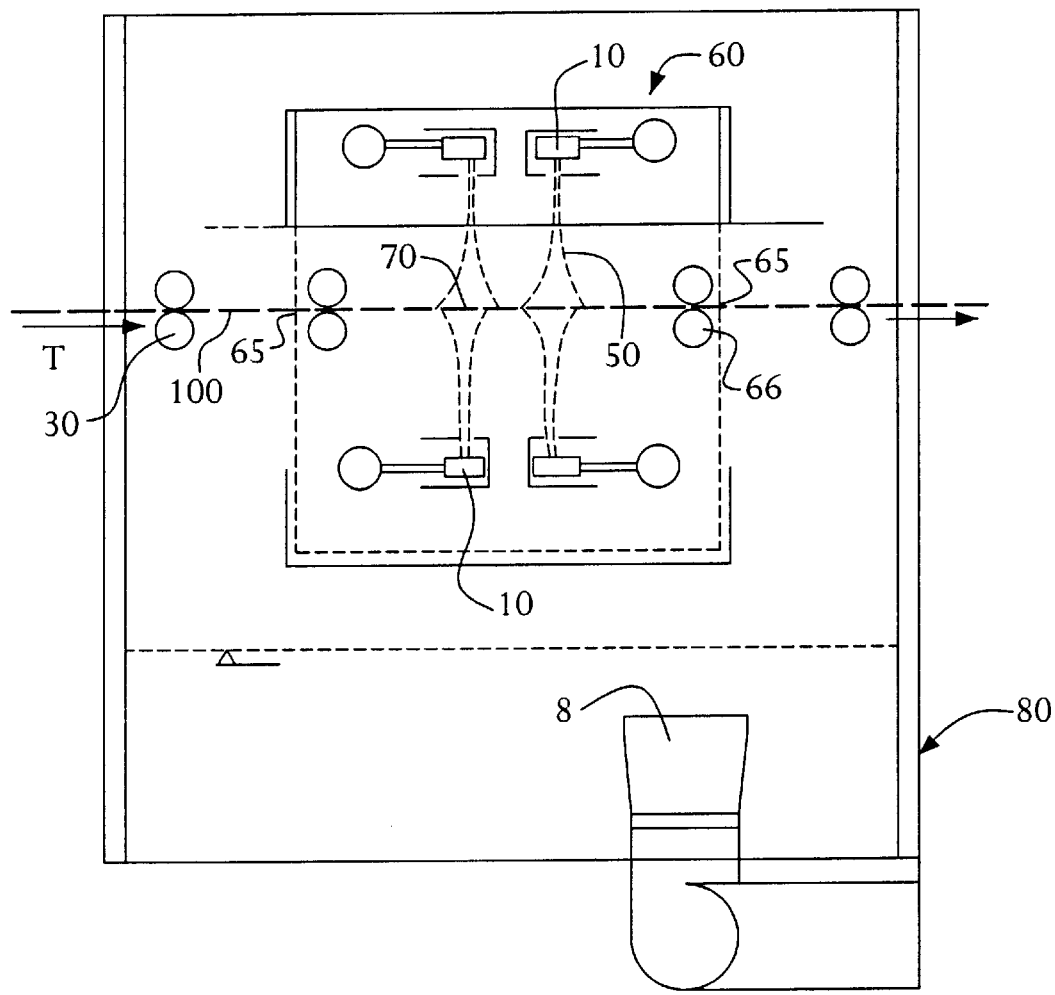

United States Patent
Baron et al.

[19]

[11] Patent Number: 6,077,359
[45] Date of Patent: Jun. 20, 2000

[54] PROCEDURE AND DEVICE FOR THE CHEMICAL AND ELECTROLYTIC TREATMENT OF PRINTED CIRCUIT BOARDS AND CONDUCTOR FILMS

[75] Inventors: David T. Baron, State College, Pa.; Reinhard Schneider, Cadolzburg, Germany

[73] Assignee: Atotech Deutschland GmbH, Berlin, Germany

[21] Appl. No.: 09/011,190

[22] PCT Filed: Jul. 5, 1996

[86] PCT No.: PCT/EP96/03032

§ 371 Date: May 18, 1998

§ 102(e) Date: May 18, 1998

[87] PCT Pub. No.: WO97/02724

PCT Pub. Date: Jan. 23, 1997

[30] Foreign Application Priority Data

Jul. 5, 1995 [DE] Germany ............................ 195 24 523

[51] Int. Cl.[7] ................................ B08B 1/02; B08B 3/02; B08B 3/04; C23G 3/02

[52] U.S. Cl. .................................. 134/2; 134/26; 134/32; 134/34; 134/902; 134/122 R; 134/131 R

[58] Field of Search .................................. 134/2, 26, 32, 134/34, 902, 122 R, 131

[56] References Cited

U.S. PATENT DOCUMENTS 4,789,405  12/1988  Blasing et al. ............................ 134/1

FOREIGN PATENT DOCUMENTS

| | | |
|---|---|---|
| 0 212 253 | 3/1987 | European Pat. Off. . |
| 24 33 653 | 1/1974 | Germany . |
| 38 13 518 | 11/1988 | Germany . |
| 4341588 | 11/1992 | Japan . |
| 4341589 | 11/1992 | Japan . |
| 4341590 | 11/1992 | Japan . |
| 1475307 | 6/1977 | United Kingdom . |

*Primary Examiner*—Zeinab El-Arini
*Attorney, Agent, or Firm*—Paul & Paul

[57] ABSTRACT

A method of treatment of printed circuit boards or conductor films with a chemical, electrolytic, or rinsing treatment liquid, and to a device for carrying out the method, where the printed circuit boards or conductor films are transported in a horizontal direction by transport means, In order to accelerate these processes, the surfaces of the printed circuit boards or conductor films must be exposed to a macroflow in order to apply active treatment liquid. Furthermore, the micromaterial exchange into the diffusion layer must be reinforced. This exchange is brought about by the use of hydrodynamically acting cavitation generators, which form cavitation bubbles in the liquid jets. The treatment liquid is set into an eddy current movement in the generators because the treatment liquid is applied at high pressure in a circuit through the nozzles generating the cavitation bubbles, and is conveyed to the surface in a large quantity. The use of the method is particularly effective in processing fine conductor printed circuit boards with fine bores and blind holes.

24 Claims, 3 Drawing Sheets

PROCEDURE AND DEVICE FOR THE CHEMICAL AND ELECTROLYTIC TREATMENT OF PRINTED CIRCUIT BOARDS AND CONDUCTOR FILMS

This is a national stage application of PCT/EP96/03032 filed Jul. 5, 1996, and now WO 97/02724.

The invention relates to a method of chemical and electrolytic treatment and rinsing of printed circuit boards and conductor films with high precision and velocity by means of a treatment liquid, and to a device for carrying out the method.

Among these treatment methods are counted particularly electroplating, film developing, film stripping, etching and stripping of metal resists, and the rinsing steps before and after these processes. A feature common to all processes is that an exchange of material is necessary at the surfaces. The intensity of the exchange of material has a decisive effect on the treatment time. Therefore attempts have been made to increase the exchange of material on the surfaces of the printed circuit boards while including the process-specific requirements. The said requirements are in particular increased by the technical development in the area of fine conductor technology with fine bore holes. In treating printed circuit boards with conductor track widths and intervals of an order of magnitude down to 0.05 mm, and bores with diameters of down to 0.15 mm, there is an addition hindrance to the exchange of materials. The precision (accuracy of the tolerances of the thicknesses of metal coatings to be observed, conductor track widths and intervals, cleanness of the surfaces treated) required in this technique however reaches the outer limits of what is industrially feasible when the treatment times are extended.

The following process-specific requirements are therefore as follows:

Electroplating:

Drilled-through-contacted printed circuit boards are to be reinforced electrolytically. Furthermore, conductor tracks which are defined by resist, are to be reinforced. In both cases a uniform distribution of coating thickness is necessary over the entire surface of the printed circuit board, including in the holes. In addition, a short treatment time, i.e. a high current density, is sought after. The structures in fine conductor technology and the occurring fine holes and particularly the blind holes set narrow limits here. The precision of electrolytic treatment must be achievable with soluble and insoluble anodes.

Film Development:

The copper-lined, drilled and through-contacted printed circuit board is coated over the entire surface with photoresist, which is also known as film. The coating thickness comes to 60 to 80 $\mu$m. The unexposed points must be developed, i.e. must be freed from the film. In the case of structures 50 $\mu$m wide, the channel to be developed out is narrower than its height. Due to diffuse light scatter during exposure, sides of the channels to be developed, particularly on the base, harden out in a more or less trapezoidal configuration. The total removal of the undeveloped resist and of the partly developed resist from the narrow channels is necessary. At the same time the exposed and thus hardened points must not be damaged or loosened at the base from the copper layer.

Film Stripping:

After electrolytic copper reinforcement, the hard and securely-adhering film must again be removed. What is required is a large-area detachment of the film, so that it remains industrially simple to filter it out of the bath solution. The trapezoidal cross-sections described above lead to an inclusion of the film by the deposited copper. The same is brought about by a copper layer which grows out in a mushroom shape over the upper edge of the resist. The resist areas so included must likewise be entirely removed. In this respect also detachment and to a lesser degree dissolution must be effected, so that it remains possible to filter the film out of the treatment liquid.

Etching:

The copper areas from which photoresist has been removed are chemically etched off as far as the base material of the printed circuit boards. The other conductor tracks and holes are protected by an etching resist. The lateral sides of the conductor tracks, from which photoresist have been removed, and the sides occurring only during etching, are not protected. The copper layer must be entirely etched out with the minimum attack on the sides. Therefore there is a requirement for a rapid and extremely uniform processing of the printed circuit boards on their upper and lower sides over the entire surface. During etching, printed circuit boards with differences of thickness in the copper layer are particularly critical. The necessary longer etching times should not be allowed to lead to under-etching.

Stripping of Metal Resist:

The removal of a metal resist, such for example as a tin/lead layer, is likewise effected chemically. The etching solution also reaches the unprotected copper sides of the conductor tracks. At these points there is a risk of dissolution of copper. Therefore an extremely uniform processing over the entire surface of the printed circuit board is also necessary for stripping of metal resist. Only this will allow the shortest possible treatment time and thus the smallest attack on the copper.

Rinsing:

For reasons of cost and environmental pollution, rinsing before and after the individual process steps in printed circuit board technology should be carried out with the minimum use of rinsing agents. In addition, the rinsing time should be kept short. Process steps such as pickling (treating with diluted sulphuric acid), conditioning and activation during through-contacting by the electroless metallisation method are to be equated to rinsing.

The described processes require for their acceleration an intensive exchange of material in the diffusion layer of the surfaces to be treated. These surfaces are always boundary layers, which are moved relatively to the liquid treatment medium. In the proximity area, in which the chemical and electrolytic process takes place on the surface, the relative liquid movement approaches zero (diffusion boundary layer). In the diffusion boundary layer, liquid adheres to the surface of the material to be treated. The proximity area in the diffusion layer is termed a viscous underlayer. Exchange of liquid does not take place here even when intense macromovements of liquid take place relative to the surface (convection). At best the diffusion boundary layer on the surface to be treated becomes thinner. The process itself remains controlled by diffusion.

Known macromovements are for example the movement of printed circuit boards, induced flow, spraying and splashing. Thus fresh treatment liquid, i.e. chemically active medium, is transported to the diffusion layer and exchanged for used liquid. This procedure is called macromaterial exchange. The material exchange in the diffusion layer is termed micromaterial exchange. In this description, this is not to be understood as the exchange of material by diffusion. Known measures for inducing a micromateral exchange are for example wiping of the surfaces or the use of ultrasound.

Technical and physical problems provide reasons why large-scale industrial application of these measures in chemical printed circuit board processes do not take place. Suitable wear-resistant wiping materials have not until now been discovered.

The effect of ultrasound is lost due to the macroflow. The ultrasound effect is based on the generation of cavitation bubbles, which are intended to implode on the diffusion layer. During implosion they release large forces in the microrange, which can cause the micromaterial exchange. It is known with vibrating ultrasound generators that the generation of the cavitation bubbles takes place so to speak statically and in layers at an interval $\mu/2$ by the ultrasound generator in the bath ($\mu$=wavelength of the ultrasound vibrations). This means that only a portion of the bubbles arises in the vicinity of the material for treatment, where they are intended to be effective. Time is required for generation of the bubbles. It is further observed that during this time the surrounding liquid may not move substantially. The resulting cavitation bubble must remain at its point of generation, otherwise it does not form.

Practice shows that the velocity of a liquid in which cavitation bubbles are to be generated may not be greater than 0.06 metres per second. Therefore ultrasound can only be effectively used in stationary baths. This however excludes the described macromaterial exchange due to flow. Therefore for micromaterial exchange by means of imploding cavitation bubbles, generated by ultrasound, there is no replacement of available fresh treatment liquid. This is a reason why ultrasound is only widely used in cleaning processes. In this case impurities such as residues from drilling, grinding or polishing are blasted off by the ultrasound effect. No chemical or electrolytic process takes place. Therefore the bringing in of active treatment liquid is of secondary importance, so that an intense macroflow in the vicinity of the material for treatment is not necessary. During cleaning the implosion of the cavitation bubbles mainly ensures the necessary mechanical support. The processes already described in printed circuit board technology are on the other hand chemical or electrolytic processes on surfaces already cleaned. These processes require a large quantity of metal ions or chemicals, which must react on the surface of the printed circuit board. This requirement can only be satisfied by the macromaterial exchange. It must take place extremely uniformly over the entire surface of each printed circuit board. Particularly in the case of fine printed conductor circuit boards, the conductor track widths and the thickness of the resist give rise to problems similar to those known in the processing of bores. The fine conductors correspond to fine bores with an aspect ratio (width of the resist channel or web to the depth of the channel or height of the web; aspect ratio) of approximately 1:2. Uniform high-quality treatment of such structures according to prior art leads to an uneconomic excursion into the likewise problematic extension of the treatment time.

Horizontal chemical processing of printed circuit boards is preferably carried out by spray technology. For this purpose there are in the literature examples and suggestions for technical constructions. Etching technique will be described in the following as a typical case of application:

Tuyère stocks move relative to the material for treatment. Oscillating and/or pivoting movements can be superimposed. In the tuyère stocks, for example, solid-cone nozzles, slot nozzles and bundle nozzles are for example used. The treatment liquid is sprayed under high or medium pressure through the nozzles on to the surfaces. The sharply-defined spray pattern as a rule always overlaps. In these areas the surface is more intensively treated. The treatment liquid flowing off from the upper surface additionally also reaches the lateral areas of the printed circuit board. In these areas therefore the surface is likewise more intensely processed. The flow-off is further influenced by the direction of the conductor tracks on the printed circuit boards. Conductor tracks lying transversely to the flow-off direction reduce the flow-off speed until puddles form, this being known as "puddle effect". Despite the most varied types of control of the sprayed medium on to the surfaces of the printed circuit boards, the uniformity achievable in spray treatment remains a problem, particularly in the case of fine conductor boards. Advantageous but also necessary is the achievable short spray treatment time. Spraying has a further basic disadvantage, i.e. the introduction of air into the treatment liquid. This leads to an intense formation of foam. Thus agents have to be added to the treatment liquids which suppress foaming. These agents are known as anti-foam (anti-foaming agents). They are incompatible with many chemicals which otherwise would be very suitable for treatment of the printed circuit boards. Therefore the selection of chemicals is restricted. Anti-foam also represents a problem in treatment of waste water and the necessary costs for this. During spray treatment, the printed circuit board has contact with the air. In addition, atmospheric oxygen is permanently carried in. The results are oxidative reactions on the printed circuit boards and with materials in the treatment liquids. For this reason also, materials which would otherwise be suitable, are excluded from these liquids. Furthermore, oxides in the copper have a negative effect. By means of spray treatment, unused treatment liquid is transported in sufficient quantity, even if irregularly, to the surfaces of the printed circuit boards. This brings about the acceptably short treatment time. However, the treatment liquid does not reach the viscous underlayer of the diffusion layer. During spraying, material exchange takes place only due to diffusion. Acceleration of the spray treatment cannot be achieved by ultrasound. When ultrasound is used it is necessary to expose the ultrasound generators, conventionally operated as resonant oscillators, to constant damping. Otherwise excessive amplitudes would destroy the generator. A liquid permanently surrounding the generator serves for damping. This at the same time removes occurring lost heat. Moreover, the ultrasonic energy may only be brought effectively to the surface of the printed circuit board by means of intensive contact via the treatment fluid (coupling). The ultrasound generator must practically be located in stationary liquid beneath the bath level, which is not possible in spraying. The micromaterial exchange by the use of ultrasound and the macromaterial exchange by spraying technique are thus mutually exclusive.

Electrolytic treatment in the submerged condition also requires an intense macromaterial exchange, which is achieved by induced flow of electrolyte. This in turn excludes the simultaneous use of oscillating ultrasound generators to generate cavitation bubbles on the surfaces of the printed circuit boards. In electrolytic metallisation, the electrolyte flow is substantially greater than it may be in order to allow the generation of cavitation bubbles.

A plurality of devices are known from prior art for electroplating treatment of metal parts, in which, in order to improve the material exchange, ultrasound oscillators are used. For example there is proposed in the Japanese disclosure documents 4-34 15 88, 4-34 15 89 and 4-34 15 90 an arrangement for treating strip steel which is moved in a pickling solution past ultrasound oscillators which are also submerged in the pickling solution and whose ultrasound waves are focused on the surfaces of the strip steel.

The Publication EP 0 212 253 A2 describes a method of cleaning and activating bore holes in horizontally guided printed circuit boards, in which the use of ultrasound is proposed. A so-called splash nozzle with elongate slots is disposed at a spacing of about 1 mm from the surface of the printed circuit board. The splash nozzle represents a special embodiment of the spray registers described above. With their aid the surfaces of the printed circuit boards are processed simultaneously with the holes. In comparison to the spray nozles, the material exchange at the surfaces of the printed circuit boards is however smaller due to the possible lower flow velocity of the treatment liquid. The diffusion layer is therefore disturbed to a lesser degree.

Therefore there is also proposed in the Publication a reinforcement to the ultrasound, the ultrasound oscillator being disposed in one embodiment on the side of the printed circuit board opposite the splash nozzle and in the immediate vicinity thereof. As the ultrasound oscillator however is disposed above the bath level, the ultrasound field can only be coupled unsatisfactorily and in a non-reproducible manner to the treatment liquid adhering to the surface of the material for treatment. Industrially available ultrasound piezo oscillators are unsatisfactory for embodying this proposal.

In another embodiment, the ultrasound oscillator is located within the nozzle housing. As however according to the method of operation of the nozzle, the velocity of the liquid flow through the nozzle comes to at least 0.6 metres per second, in this case the following would have to be accepted: the cavitation bubbles arise at a spacing of $\lambda/2$ from the generator and substantially remain there. However, they also preferably arise at the intermittent points of the liquid. The surfaces of the container, for example of the interior of the nozzle, and the walls of the nozzle are such points. The cavitation bubbles implode on the walls and thus attack them intensely. The result is that the predominating portion of the cavitation bubbles would then act destructively on the splash nozzle itself, without being able to emerge from the nozzle. Therefore practically the only effect of this embodiment remaining would be the splash of the treatment liquid against the surface of the printed circuit boards.

A further disadvantage of the splash nozzle resides in the fact that only the gap width of the nozzle is effective for the liquid treatment. Thus a splash nozzle represents only a small treatment path. For this reason a plurality of splash nozzles disposed transversely to the horizontal transport direction are necessary per process for treatment of printed circuit boards. Between these there must be disposed a sufficient number of transport guide rollers in order reliably to maintain the small spacing of 1 mm between the printed circuit board and splash nozzle. This becomes apparent as a particularly serious problem in the case of conductor films. The sensitive material should not slide along the splash nozzles. This would lead to damage of the film surface and of the conductor tracks. The splash treatment paths which are short and of which therefore a large number are required, and the necessary transport rollers lying therebetween, lead to long system lengths with correspondingly high costs.

A further arrangement for improving the material exchange, particularly in fine holes in printed circuit boards, is described in the Publication DE 38 13 518 A1. This discloses a machine for cleaning and/or rinsing bore holes in printed circuit boards, in which the printed circuit boards are passed in a horizontal position and in a horizontal direction between a pressure nozzle and a suction nozzle lying opposite it on the other side of the transport plane. In this way likewise an improved material exchange is to be achieved. However, no proposals are made to reinforce the treatment effect by the use of ultrasound, so that only the relatively weak macroflow is available for an effective material exchange on the boundary surface of the printed circuit boards with the treatment liquid.

The German Disclosure Document 24 33 653 discloses a method for treating a liquid and its use for treating an article and a device for carrying out the method. In the device described, an eddy current is generated in the liquid, so that the liquid emerging from the device is subjected to a cavitation effect. By means of the proposed method and device it is possible effectively to clean, de-scale and pickle articles, particularly castings. For this purpose the parts are to be submerged in a tank in which the treatment liquid is located, and treated therewith by means of laterally-attached nozzles, from which the liquid subjected to cavitation emerges under high pressure.

Furthermore it is also known to use a liquid flow subjected to a method for hydrodynamic generation of cavitation in de-greasing and rinsing baths, for treatment of material in drums, baskets and on frames. Such a system is indicated in the previously-published prospectus "Cleaning with Hydroson" of the Company Atotech Deutschland GmbH, Berlin, DE.

Although the method for hydrodynamic generation of process-accelerated cavitation bubbles is known, another path was followed in printed circuit board technology for effective treatment of printed circuit boards. Attempts have been made for many years to achieve improvements and/or accelerations in the chemical and electrolytic processes by the use of ultrasound by means of oscillating generators. The many technical proposals in the literature did not lead to large-scale industrial use, because until now effective reinforcement of these printed circuit board processes has been unsuccessful.

Even in hydrodynamic generation of liquid flow subjected to cavitation, the spacing of the nozzle openings from which the flow emerges from the material for treatment has to be considered. It is in fact not necessary, as with the use of the splash wave, to observe a very small and constant spacing from the nozzle opening. As the disadvantages of spray nozzles, which are revealed for example as the intense development of foam, are to be avoided, the spray of liquid should emerge as far as possible within the treatment liquid from the nozzle opening. Thus a maximum spacing of the nozzle opening from the surface of the material for treatment must be observed, as the liquid jet rapidly loses kinetic energy due to friction in the substantially stationary treatment liquid, the spray cone expands and the cavitation bubbles to some extend decompose in the solution.

Therefore the problem underlying the present invention is to find a method by means of which the disadvantages of prior art can be avoided. In particular a method is to be found for chemical and electrolytic treatment and rinsing of printed circuit boards and conductor films, inclusive of the holes and blind holes, which is preferably suitable to satisfy the described requirements in fine conductor technology. At the same time, with high precision of liquid treatment, short treatment times and thus short system lengths are to be achieved.

In order to solve this problem a method is proposed which, in harmony with the described process-specific requirements, enables the simultaneous macro- and micro-material exchange on the surfaces to be treated. For this purpose a cavitation generator according to the German Disclosure Document 24 33 653 is disposed under the bath level in a test bath in a horizontal arrangement and transport direction of the printed circuit boards. The device according to the invention comprises a container for accommodating treatment liquid, means of transporting the printed circuit boards guided above the container and disposed in a horizontal position in a horizontal direction, means of forming a liquid build-up space on the upper side of the printed circuit boards, nozzles (cavitation generators) for transporting the treatment liquid on to the surfaces of the printed circuit boards, and at least one pump for conveying the treatment liquid into the nozzles at a pressure of at least 10 bar. Provided in the nozzles in order to generate a liquid jet with high velocity and cavitation bubbles contained in the jet is a first cylindrical inner space, into which the treatment liquid is conveyed by means of the pumps, and a further second cylindrical inner space, which can for example be in axial registry with the first space and is connected to the first by means of at least one bore hole leading substantially tangentially into the second space, so that the liquid is transported from the first space into the second and can thus be subjected to an intense eddy current movement. The cross-section of the second space tapers towards the nozzle opening from which the liquid jet emerges at high velocity.

The nozzle openings are at a spacing of 20 to 300 mm from the surfaces of the printed circuit boards. The high velocity of the treatment liquid is achieved by means of at least one high-pressure pump with a pressure of up to 30 bar. The flow of liquid emerging from the nozzle is directed towards a printed circuit board to be treated. In this respect the liquid flow at the same time transports cavitation bubbles on to the surface of the printed circuit board. It has been discovered that the cavitation bubbles remain in existence when they are in a liquid flow whose flow velocity lies above the threshold existing via the oscillating ultrasound generators by orders of magnitude of 0.06 metres per second. Thus the treatment liquid rapidly flowing in the direction of the surface of the printed circuit board is suitable for macromaterial exchange and at the same time also as a transport means for the cavitation bubbles on to the diffusion layer in order to activate the micromaterial exchange. During the tests, in addition, a disproportionately rapid chemical and electrolytic treatment of fine holes and blind holes was observed, when they are exposed to the liquid flow which contains cavitation bubbles.

Thus the requirements for chemical and electrolytic treatment of horizontally transported and flooded printed circuit boards can be satisfied. The liquid flow ensures the necessary macromaterial exchange on the diffusion layer, and the cavitation bubbles carried along with the liquid flow ensure the micromaterial exchange on the viscous underlayer.

The eddy current movement of the treatment liquid emerging from the nozzles is formed by a substantially tangential feed of the treatment liquid into a cylindrical hollow space in the nozzles and leading to a nozzle opening. Further, the treatment liquid is transported at such high pressure from the nozzle openings that it flows out with a linear velocity of at least 2.5 metres per second.

In order to be able to transport a larger quantity of liquid per unit of time on to the surface of the printed circuit boards, it is also possible to provide a plurality of nozzle openings, of which each communicates respectively with a cylindrical hollow space, into which the treatment liquid is fed substantially tangentially, or all communicate together with a single cylindrical hollow space.

In horizontal printed circuit board systems, there is formed by known means above the printed circuit boards a liquid build-up space, for example by means of squeezing rollers. This build-up space forms the upper treatment bath, which is flooded with treatment liquid. For electrolytic treatment, the anodes are located on both sides, i.e. on the upper and underside of the printed circuit board. These anodes are soluble and/or insoluble. The nozzles are located between the anodes or behind them with corresponding anode openings.

Substantial disadvantages of known spray technology are avoided by flooding the printed circuit boards to be treated by means of a liquid build-up space. No measures for controlling the spray pattern on the printed circuit board are necessary, because the borders of the liquid flows are fluid under the bath level, i.e. are undefined. All the surfaces are acted on uniformly with electrolyte. The electrolyte does not run down from the upper side of the printed circuit board. The problems caused by this are eliminated. Because spraying is omitted, there is no formation of foam in the treatment liquid. For this reason the anti-foaming agents can be omitted. This in turn allows the use of further chemicals which are incompatible with these agents. At the same time the waste water is relieved of charge, which further reduces costs. The introduction of oxygen into the bath is avoided. A disadvantage in the treatment of flooded printed circuit boards according to known methods however is the low process speed. The reason for this is the insufficient material exchange, particularly the micromaterial exchange into the diffusion layer. In this case the material exchange is effected practically only by diffusion. The treatment time is correspondingly long and unsatisfactory. The invention solves this problem by combination of flooding of printed circuit boards with an induced macroflow of fresh treatment liquid on to the diffusion layer of the surface of the printed circuit board. The flowing treatment liquid is at the same time enriched with cavitation bubbles. The bubbles implode on the diffusion layer. This causes an intensive micromaterial exchange into the diffusion layer and as far as the viscous underlayer. In this way the thickness of the diffusion boundary layer in which the material transport only takes place by diffusion, is reduced to an extremely small value. By means of the macro- and micromaterial exchange the treatment time is drastically reduced. It lies at 50% of the known spray technique. By means of the intensive micromaterial exchange, the problems described arising in fine conductor technology are also solved. The large-area induced flow of treatment liquid on to the surfaces of the printed circuit boards leads to a situation in which larger areas of the surface of the printed circuit boards are simultaneously intensively treated than when the known splash wave is used. The system can be correspondingly shorter. The active zones of the individual processes are shortened to approximately half in comparison to the spray technique.

The spacing between the nozzle and the printed circuit board is selected in dependence on the nozzle opening angle in such a way that the surfaces of the printed circuit boards are totally contacted by the electrolyte flow. The spacing lies between 20 mm and 300 mm, preferably between 50 mm and 150 mm. By means of a bath equipped in this way the material for treatment is transported horizontally. Transport rollers or discs serve for propulsion and guidance.

In order that the surfaces of the printed circuit boards, as they are transported past the nozzles, are brought into contact as uniformly as possible with the treatment liquid on both sides and to the same width, a plurality of nozzles can preferably be provided above and beneath the transport plane in which the printed circuit boards are transported. On both sides, i.e. above and below, the number of nozzles is to be selected transversely to the transport direction such that all the surfaces are reached at least once by the flow of treatment liquid. In this case the nozzles are disposed lying opposite one another on both sides of the printed circuit boards and arranged in such a way that, transversely to the transport direction, all the surface areas of the printed circuit boards or conductor films are uniformly contacted by the emerging treatment liquid. The offsetting of the nozzles between the upper and the under side is so selected that an upper nozzle has no lower nozzle opposite it and vice versa. Preferably, the nozzles are disposed mutually offset on both sides of the printed circuit boards, so that the jets of liquid do not mutually hinder one another in the bores passing through the printed circuit boards.

The nozzles can be disposed on either side of the printed circuit boards in respectively at least one row substantially transversely to the transport direction. The spacing between adjacent nozzles on either side of the printed circuit boards should be so set that, dependent on the opening angle of the treatment liquid emerging from the nozzle openings transversely to the transport direction, all the surface areas of the printed circuit boards can be reached by the treatment liquid. For example, the nozzles offset to one another on both sides of the printed circuit boards may be alternatingly offset to one another.

In another embodiment, the nozzles however may also be disposed so as to be directly opposite one another. In this case however the nozzles disposed opposite one another on both sides of the printed circuit boards must be switched on and off one after the other in an alternating time sequence. Thus the jets of liquid from the opposite nozzles do not hinder one another during processing of the bore walls of the printed circuit boards. The alternating switching, at half the transport speed, allows shortening of the active path of the system to half in comparison to the alternate arrangement, if at the same time the number of nozzles is doubled.

The printed circuit boards and conductor films are guided by transport rollers or transport discs. The rollers or discs are partly or totally driven. In particular, an induced flow of treatment liquid can be applied between the transport discs in an almost unhindered manner on to the printed circuit boards.

The following schematic Figures serve further to illustrate the invention and further preferred embodiments.

Figure 2:
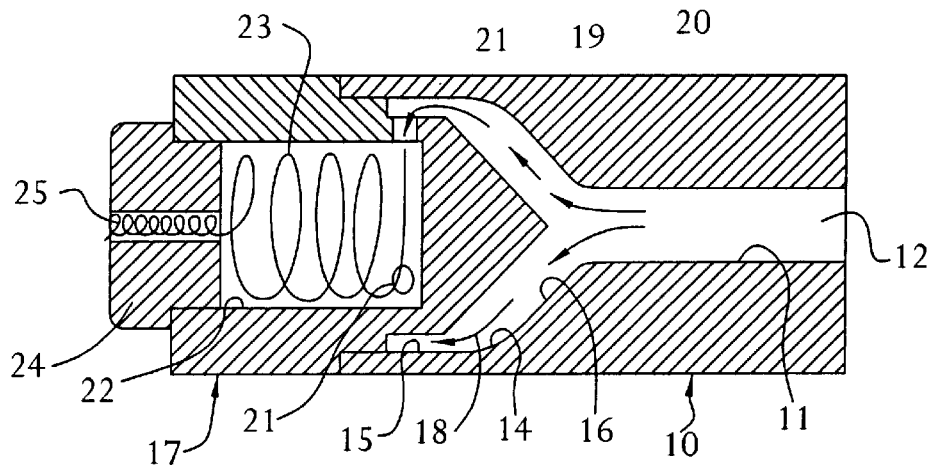
Figure 3:
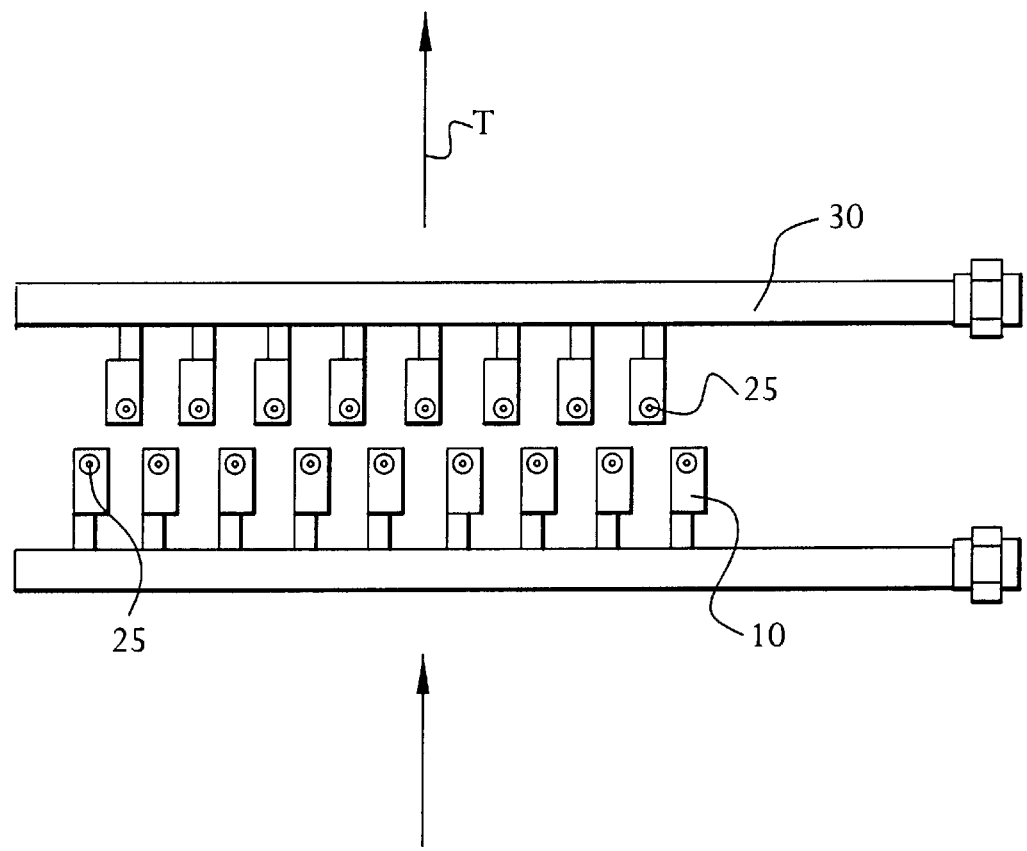
Figure 4:
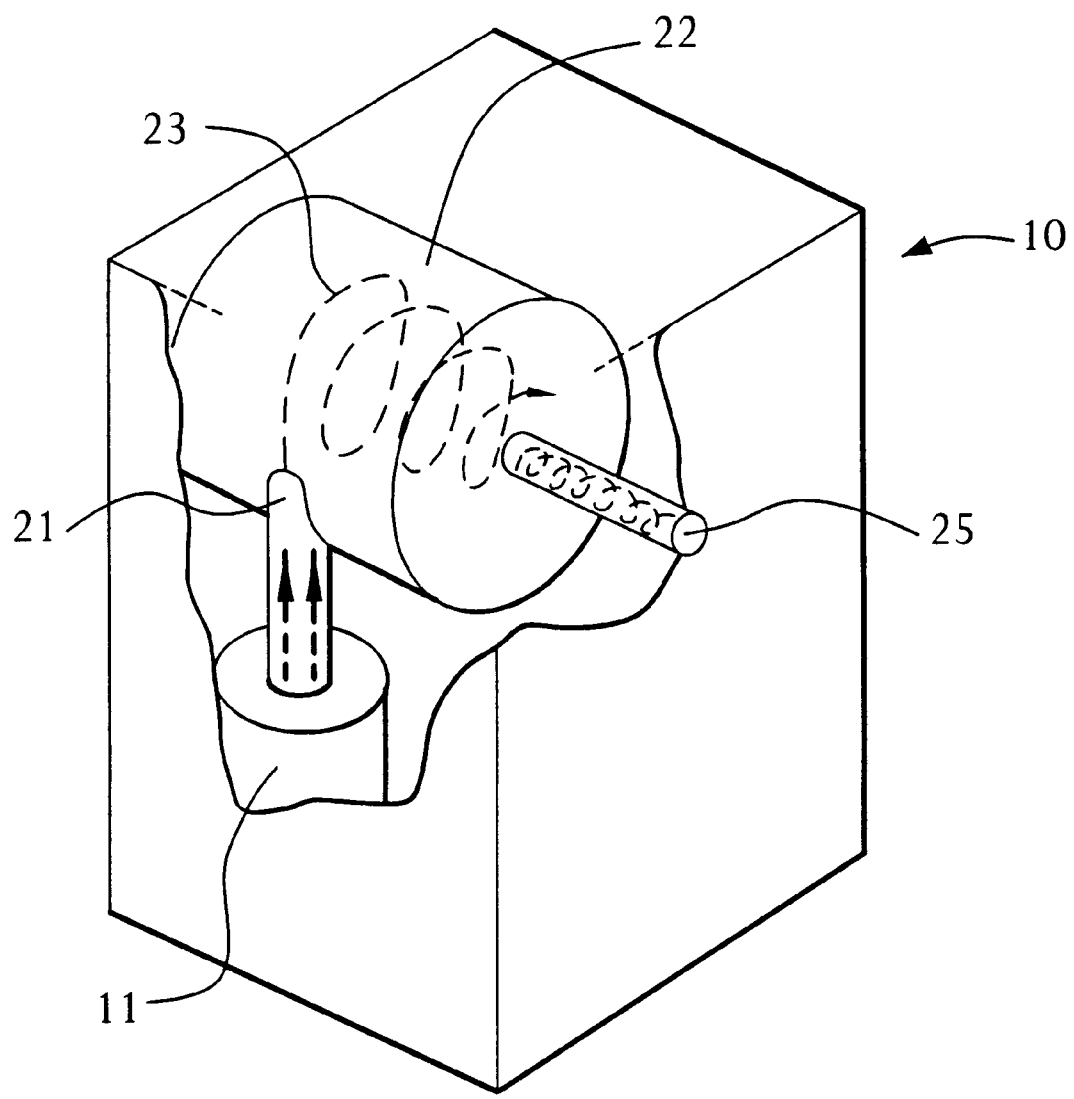

FIG. 1: theoretical view of a device for chemical treatment, overall view,

FIG. 2: device for generating the eddy current,

FIG. 3: a further embodiment of a device for generating the eddy current,

FIG. 4: theoretical view of a device with nozzles.

FIG. 1 shows the principle of a horizontal continuous system for treating printed circuit boards and conductor films in a side elevation. The printed circuit boards pass through the system in the horizontal transport plane 100 from the left to the right and are moved forward by driven transport rollers or discs 90. After entering the flood container 60, the printed circuit board is located totally within the treatment liquid. At this point there are also squeezing rollers 66, which prevent emergence of the treatment liquid from the flood area into the flood container 60. For this purpose the lower portion of the flood container 60 is filled beneath the transport plane 100 by means of pumps (not shown) with the treatment liquid. The upper portion of the flood container 60 is filled with the treatment liquid emerging from the nozzles 10, until said liquid flows over the upper edge of the flood container 60. Treatment liquid likewise flows continuously at the narrow lateral slots 65 by means of which the printed circuit boards are introduced into the flood container 60, into the surrounding system, in which there is located a catchment container 80 for the treatment liquid. The treatment liquid in the catchment container 80 is removed through a suction nozzle 85 by means of pumps (not shown) and transported at a pressure of up to 30 bar into the nozzle pipes 30.

During transport through the flood container 60 the printed circuit boards pass the liquid jets 50, located within the treatment liquid, which emerge from the nozzles 10. The treatment liquid is transported by the nozzle tubes 30 into the nozzles 10. A plurality of nozzles 10 are disposed on the one hand above and beneath the transport plane 100, further in the transport direction T one behind the other and on the other hand in a row vertical to the transport direction T and to the plane of the drawing. In this way, as they pass through the treatment zones 70, all the surface areas of the printed circuit board are brought into contact with the jet of treatment liquid.

In the example shown, the oppositely-lying nozzles 10 in the rows transverse to the transport direction T may be disposed offset to one another. Should the nozzles 10 however stand directly opposite one another, the upper and lower nozzles 10 must be alternately switched on and off in order to avoid mutual hindrance of the individual liquid jets 50.

A construction of the nozzle 10 is shown in FIG. 2. The nozzle 10 contains an axial liquid channel 11 (cylindrical inner space), which has an inlet opening 12. The inlet opening 12 however can be provided, differently from FIG. 2, as a lateral opening, so that the treatment liquid enters not axially but substantially radially into the liquid channel 11. The inlet opening 12 is provided with an internal thread for connection to the nozzle pipe 30. The liquid channel 11 is expanded at one end in order to form a mouth 14, which contains a cylindrical section 16. A hollow inset 17 is inserted into and connected with the mouth 14. The insert 17 has a section 18 which has a smaller diameter than the internal diameter of the mouth 14. The insert 17 is conically formed 19 at its end facing the channel 11.

Formed by the insert 17 and the mouth 14 is an annular channel, which is connected to the inner hollow space 22 of the insert 17 by bores 21 in the insert 17 leading substantially tangentially into the hollow space. For example three such bores 21 may be produced in the insert, which are offset to one another by a respective 120°. All the tangential bores are aligned to one another in the same direction of rotation.

The open end of the insert 17 is terminated by a bush 24. In this bush there is a further bore 25 as a nozzle opening, which has a substantially smaller diameter than the inner hollow space in the insert 17.

The treatment fluid is led in under pressure through the inlet opening 12 into the liquid channel 11 and passes from this point through the annular channel between the insert 17 and the mouth 14 through the tangentially-produced bores 21 into the inner hollow space in the insert 17. Due to the substantially tangential arrangement of the bores, the treatment liquid is given a rotational impulse and is thus set in rotary motion 23 in the hollow space. Upon further passing through the bore 25 in the bush 24, the liquid, due to having obtained the rotary impulse, is set in even more rapid rotary motion, as the liquid now, due to the smaller diameter of the bore 25, can only carry out extremely small rotational amplitudes. At the same time the treatment liquid is accelerated in the bore 25. At a nozzle opening of about 4 mm, the treatment liquid passes through the nozzle opening at a linear velocity of about 12 metres per second.

As the treatment liquid, after it emerges from the nozzle opening as an eddy flow, rotates further and moves apart radially due to centrifugal force induced by the rotation of the jet, there form within the resultant spray cone vapour bubbles which, when impacting on the printed circuit boards, implode in the treatment zone 70 and thus bring about the cavitation effect.

In order to produce the effect of cavitation on the surface of the printed circuit boards as effectively as possible, the spacing of the nozzle outlet opening from the surface of the printed circuit board must be within a range of 20 to 300 mm, preferably between 50 mm and 150 mm.

FIG. 3 shows a further embodiment of the nozzle 10. In this case the treatment liquid, coming from below, is fed into the hollow space 11 in the nozzle 10. From this point it passes under pressure through the bore 21 tangentially into the hollow space 22. By the tangential feed, the treatment liquid is set into a rapid rotary movement 23 in the hollow space 22. The hollow space narrows towards the nozzle outlet opening 25. Due to the rapid flow of the treatment liquid, this latter is set into a rotational movement in the narrow channel leading to the nozzle outlet opening 25, said movement having a higher frequency than that in the hollow space 22. By means of this eddy current movement, the treatment liquid passes out of the nozzle outlet opening 25 at high velocity.

FIG. 4 shows the arrangement of two tuyère stocks for an assembly above and beneath the transport plane. The two tuyère stocks disposed one behind the other in the transport direction T each consist of a nozzle pipe 30 with attached thereto nozzles 10 with nozzle openings 25. Due to the offset arrangement of the nozzles in the two rows, further regularisation of treatment of the surfaces of the printed circuit boards can be achieved.

The use of the method is particularly effective in the processing of fine conductor boards with fine bores and blind holes. Within a chain of baths of a transfer system for printed circuit boards, different treatment liquids are used at different temperatures. For mass production and for reasons of calibration of the nozzles and control of the treatment result by means of the process, as many similar nozzle systems as possible are to be used. For this reason, the pump used to generate the eddy current can be operated or regulated also in dependence on the liquid used and of its temperature, with varying pressure and varying volume flow. This is effected within certain limits before another nozzle size/diameter of the opening is used, so that the treatment results or the formation of cavitation bubbles remains the same as far as possible.

What is claimed is:

1. A method of treatment of printed circuit boards or conductor films with a treatment liquid; said method comprising the steps of transporting the printed circuit boards or conductor films in a horizontal direction along a transport plane by
    passing the printed circuit boards or conductor films through a bath of the treatment liquid;
    contacting an underside of the printed circuit boards or conductor films with the treatment liquid in a treatment bath;
    contacting an upper side of the printed circuit boards or conductor films with the treatment liquid in a liquid build-up space;
    passing the treatment liquid through nozzles that are in the bath of treatment liquid and that are at a spacing of 20 to 300 mm from the transport plane;
    applying the treatment liquid onto surfaces of the printed circuit boards or conductor films as a liquid jet from said nozzles, thereby,
    forming cavitation bubbles within the liquid jet, wherein the cavitation bubbles are generated by outflow of the treatment liquid, which is under high pressure and set in an eddy current movement from the nozzles, whereby,
    the cavitation bubbles are applied onto the surfaces of the printed circuit boards or conductor films.

2. The method according to claim 1, whereby the eddy current movement of emerging treatment liquid emerging from the nozzles is formed by a substantially tangential feed of the treatment liquid into a cylindrical hollow space in the nozzles and leading to a nozzle opening.

3. The method according to claim 2, whereby the eddy current movement is rotational and its velocity is increased by narrowing the cylindrical hollow space in a direction of the nozzle opening.

4. The method according to one of claims 1 and 2, whereby the pressure of the treatment liquid out of nozzle openings is so selected that it emerges at a linear velocity of at least 2.5 meters per second.

5. The method according to one of claims 1 and 2, whereby the treatment liquid is passed out of a plurality of nozzle openings provided in said nozzles, whereby each of the nozles communicates respectively with a cylindrical hollow space in a nozzle.

6. The method according to one of claims 1 and 2, whereby the nozzles are disposed above and beneath the transport plane and lying opposite one another, whereby, all surface areas of the printed circuit boards or conductor films are uniformly reached by an emerging treatment liquid in a path transverse to a transport direction.

7. The method according to claim 6, whereby the nozzles disposed above and beneath the transport plane and lying opposite one another are alternately switched on and off one after the other in an alternating time sequence.

8. The method according to one of claims 1 and 2, whereby the treatment liquid contained in the bath is applied into the nozzles at high pressure of at least 10 bars by at least one pump.

9. The method according to one of claims 1 and 2, whereby the nozzles are offset to one another mutually above and beneath the transport plane.

10. The method according to one of claims 1 and 2, whereby the printed circuit boards or conductor films are guided by at least one element selected from a group of driven and non-driven transport discs.

11. The method of any one of claims 1 and 2, whereby the printed circuit boards or conductor films are transported in a horizontal direction in a transport plane by transport means.

12. The method according to claim 11, whereby velocity and pressure of the emerging treatment liquid, and diameter of the nozzle opening are all adjusted in dependence on said treatment liquid and temperature of the treatment liquid in order to achieve a substantially uniform cavitation formation.

13. The method according to claim 1, where the treatment liquid is a rinsing liquid.

14. The method according to claim 1, where the treatment liquid is a chemical treatment liquid.

15. The method according to claim 1, where the treatment liquid is an electrolytic treatment liquid.

16. A device for chemical treatment of printed circuit boards or conductor films with a treatment liquid, whereby the printed circuit boards or conductor films are transported in a horizontal position in a transport plane by transport means, wherein said device comprises:

a first container for accommodating treatment liquid;

means for transporting the printed circuit boards or conductor films guided above the first container and disposed in a horizontal direction along a transport plane;

means for forming a liquid build-up space above the transport plane, and a second container disposed beneath the transport plane for accommodating the treatment liquid, whereby an underside of the printed circuit boards or conductor films can be brought into contact with the treatment liquid in the second container;

nozzles disposed at a spacing 20 to 300 mm from at least one side of the transport plane for applying the treatment liquid on surfaces of the printed circuit boards or conductor films; and at least one pump for applying the treatment liquid into the nozzles at a pressure of a least 10 bars, and in order to generate a liquid jet with high velocity and cavitation bubbles contained in the jet, the nozzles further comprising:

a first cylindrical inner space, into which the treatment liquid is applied by at least one pump;

a second cylindrical inner space communicating with the first space through at least one bore leading in a position substantially tangential into the second space, whereby the treatment liquid is transported out of the first space into the second space, whereby said treatment liquid can be set into an eddy current movement, and the cross-section of the second space tapering towards a nozzle opening, through which the liquid jet emerges at such high velocity that cavitation bubbles are formed in the liquid jet.

17. The device according to claim 16, whereby a plurality of nozzles are disposed above and beneath the transport plane.

18. The device according to claim 17, whereby the nozzles are disposed above and beneath the transport plane, in at least one row, lying in a position substantially transverse to a transport direction.

19. The device according to claim 18, where by spacing between adjacent nozzles above and beneath the transport plane is so selected in dependence of an opening angle of emerging treatment liquid from the nozzle openings, where said nozzle openings are positioned transversely to the transport direction, whereby all surface areas of the printed circuit boards or conductor films can be reached by the treatment liquid.

20. The device according to one of claims 16 to 19, whereby the nozzles are disposed on both sides of the transport plane and alternately and mutually offset to one another.

21. The device according to one of claims 16 to 19, whereby rollers extend transversely to the transport direction above the transport plane as means for forming a liquid build-up space.

22. The device according to claim 16, where the treatment liquid is a rinsing liquid.

23. The device according to claim 16, where the treatment liquid is a chemical treatment liquid.

24. The device according to claim 16, where the treatment liquid is an electrolytic treatment liquid.

* * * * *